(12) United States Patent
Manku

(10) Patent No.: US 7,710,185 B2
(45) Date of Patent: May 4, 2010

(54) TUNEABLE CIRCUIT FOR CANCELING THIRD ORDER MODULATION

(75) Inventor: Tajinder Manku, Waterloo (CA)

(73) Assignee: Icera Canada ULC, Calgary (CA)

( * ) Notice: Subject to any disclaimer, the term of this patent is extended or adjusted under 35 U.S.C. 154(b) by 3 days.

(21) Appl. No.: 11/569,021

(22) PCT Filed: May 12, 2005

(86) PCT No.: PCT/CA2005/000798

§ 371 (c)(1),
(2), (4) Date: Nov. 13, 2006

(87) PCT Pub. No.: WO2005/109628

PCT Pub. Date: Nov. 17, 2005

(65) Prior Publication Data

US 2008/0007334 A1 Jan. 10, 2008

Related U.S. Application Data

(60) Provisional application No. 60/570,929, filed on May 13, 2004.

(30) Foreign Application Priority Data

May 12, 2004 (CA) .................................... 2467184

(51) Int. Cl.
*G06F 7/44* (2006.01)
*G06G 7/16* (2006.01)

(52) U.S. Cl. .................. 327/359; 327/103; 327/317

(58) Field of Classification Search ................. 327/103, 327/359, 317
See application file for complete search history.

(56) References Cited

U.S. PATENT DOCUMENTS 4,422,051 A  12/1983  Katakura et al.
(Continued)

FOREIGN PATENT DOCUMENTS

EP  1193863 A2  4/2002
(Continued)

OTHER PUBLICATIONS

European Application 05748731.6: search report dated Feb. 6, 2009.
(Continued)

*Primary Examiner*—Lincoln Donovan
*Assistant Examiner*—John W Poos
(74) *Attorney, Agent, or Firm*—Borden Ladner Gervais LLP; Shin Hung

(57) ABSTRACT

A CMOS transconductor for cancelling third-order intermodulation is provided. The transconductor includes a transconductance circuit and a tuneable distortion circuit. The transconductance circuit takes an input voltage and generates an output current having a transconductance element and an IM3 element. The distortion circuit takes the same input voltage and generates a current having an IM3 element of equal amplitude and opposite phase to the IM3 element of the transconductance circuit. A controller circuit tunes the distortion circuit to adjust its IM3 element to substantially equal the amplitude of the IM3 of the transconductance circuit. The distortion and transconductance circuits are arranged to sum their output currents thereby effectively cancelling the IM3 elements, leaving the transconductance relatively unmodified.

15 Claims, 8 Drawing Sheets

U.S. PATENT DOCUMENTS

| | | |
|---|---|---|
| 4,720,685 A | 1/1988 | Garuts |
| 5,497,123 A | 3/1996 | Main et al. |
| 5,523,717 A * | 6/1996 | Kimura ........................ 330/252 |
| 5,912,583 A * | 6/1999 | Pierson et al. .............. 327/553 |
| 6,278,299 B1 | 8/2001 | Madni et al. |
| 6,515,542 B1 | 2/2003 | Wang et al. |
| 6,734,722 B1 * | 5/2004 | Hsu ........................... 327/563 |
| 6,917,322 B2 * | 7/2005 | Ueno et al. ................. 341/144 |
| 7,102,342 B2 * | 9/2006 | Kim ........................... 323/316 |
| 2003/0128071 A1 * | 7/2003 | Nguyen et al. .............. 330/254 |

FOREIGN PATENT DOCUMENTS

| | | |
|---|---|---|
| EP | 1345320 A2 | 9/2003 |
| GB | 2223902 | 4/1990 |

OTHER PUBLICATIONS

International Patent Application No. PCT/CA2005/000798 International Search Report, dated Aug. 16, 2005.

* cited by examiner

TUNEABLE CIRCUIT FOR CANCELING THIRD ORDER MODULATION

FIELD OF THE INVENTION

The invention relates generally to radio frequency (RF) circuitry. More particularly, the invention relates to tuning out the third order intermodulation distortion term in transconductance circuitry in CMOS technology.

BACKGROUND OF THE INVENTION

Wireless devices have been in use for many years for enabling mobile data and communication. Such devices can include mobile phones and wireless enabled personal digital assistants (PDAs) for example. FIG. 1 is a generic block diagram of the core components of such wireless devices. The wireless core 10 includes a baseband processor 12 for controlling application specific functions of the wireless device and for generating and receiving voice or data signals to a radio frequency (RF) transceiver chip 14. The RF transceiver chip 14 is responsible for frequency up-conversion of transmission signals, and frequency down-conversion of received signals. The RF transceiver chip 14 includes a receiver core 16 connected to an antenna 18 for receiving transmitted signals from a base station or another mobile device, and a transmitter core 20 for transmitting signals through the antenna 18 via a gain circuit 22. Those of skill in the art will understand that FIG. 1 is a simplified block diagram, and can include other functional blocks that may be necessary to enable proper operation or functionality.

Third-order intermodulation (IM3) is a common interference problem in RF where two or more signals mix in a non-linear phase or "device" to form one or more new signals, and thereby creating intermodulation products. In the RX section of a transceiver chip, these intermodulation signals may fall on top of a desirable signal (in frequency domain) thereby reducing the signal to noise ratio. For the TX section, intermodulation may cause the signal to spread out causing power to leak in a neighbouring band. Various elements within a radio use transconductance cells. These transconductance cells convert voltage into current, but also add third order harmonic distortion. As an example, active mixers typical use transconductance cells as an input stage to the mixing cell and are widely used in modern communication systems in order to achieve frequency translation of the carrier signals. Intermodulation distortion in the mixer affects the dynamic range of most communication systems. The IM3 of transconductance cells is governed by the voltage to current transfer function produced by elements within the cell (i.e. transistors) and the amount of feedback in the circuit A typical output of a transconductance circuit is given by:

$$i_{out} = A_1 v_{in} + A_3 v_{in}^3 + \ldots$$

where $i_{out}$ is the output current, $A_1$ is the transconductance gain of the circuit, $v_{in}$ is the input voltage, and $A_n$ are distortion terms where n>3. However, a nearly linear relationship between $i_{out}$ and $v_{in}$ is desirable since many communications standards specify the amount of distortion that is acceptable. Failure to comply with such standards may result in non-certification of a device. It is therefore desirable to eliminate distortions.

In the past, distortion cancellation was accomplished by techniques employing bipolar transistors as shown in such references as U.S. Pat. No. 6,781,467 (Sun), U.S. Pat. No. 5,497,123 (Main et al), S. Otaka, M. Ashida, M. Ishii, T. Lakura, "A+10 dBm IIP3 SiGe Mixer with Cancellation Technique," ISSCC2004, and B. Gilbert, "The MICROMIXER: A highly linear variant of the Gilbert mixer using a bisymmetric class-AB input stage" in J. Solid-State Circuits, vol. 32, pp. 1412-1423, September 1997. The general approach of linearization is to add circuitry such that the terms $A_n$ are brought to zero and $A_1$ remains approximately the same (in most cases $A_1$ reduces); note, for an ideal amplifier $A_n = 0$, where n is greater than or equal to 3. In Main et al and Otaka, $A_3$ is made up of two terms that oppose each other; i.e.

$$A_3 = A_3^+ - A_3^-$$

where $A_3+$ and $A_3-$ are made equal using component values in the circuit. In Main et al a phase shifting technique is used and is applied to a mixer architecture. In Otaka, a resistor value is used set the $A_3$ to zero. The linearization technique used by Gilbert consists of pre-distorting the signal so that the terms $A_n$ are set to zero at the output after it passes thru a distorting amplifying stage, which will introduces excessive noise. Sun uses bipolar transistor technology for a low noise amplifier. All these methods reduce the amount of third order distortion, but these past implementations are bipolar based, opposed to Complementary Metal Oxide Semiconductor (CMOS) based. The advantages of CMOS technology are cost and the fact the technology improves at a rate given by Moore's Law. These techniques are also susceptible to manufacturing variations in device parameters. Specifically, the IM3 may not be reduced because of variations in transistors parameters from part to part. Other techniques use feedback to reduce the amount of IM3 in a circuit. However feedback circuits introduce noise and increase the total amount of current and area required by the circuit.

Such techniques also employ SiGe or GaAs devices and technology, which although they exhibit highly linear characteristics, the technologies are new and expensive. Consequently, the cost of manufacturing often outweighs the benefits of using such devices.

It is therefore desirable to provide CMOS technology for tuning out IM3 products in transconductance circuits. The invention described below is a tuneable method for reducing the IM3 tone in a transconductance element so to make it less susceptible to manufacturing variations and the transconductance implementation is described within CMOS technology.

SUMMARY OF THE INVENTION

It is therefore an object of the invention to obviate or mitigate at least one disadvantage of previous IM3 cancellation circuits. More specifically, it is an object of the invention to provide a system for a providing a transconductor for tuning IM3 component out of CMOS circuitry.

In a first aspect, the invention provides a CMOS transconductor for cancelling third-order intermodulation of an output current corresponding to an input voltage. The transconductor includes a transconductance circuit and a tuneable distortion circuit. The transconductance circuit takes an input voltage and generates an output current having a transconductance element and an IM3 element. The distortion circuit takes the same input voltage and generates a current having an IM3 element of equal amplitude and opposite phase to the IM3 element of the differential circuit. A controller circuit tunes the distortion circuit to adjust its IM3 element to substantially equal the amplitude of the IM3 of the differential circuit. The distortion and differential circuits are arranged to sum their output currents thereby effectively cancelling the IM3 elements, leaving the transconductance relatively unmodified.

In a further embodiment of the invention, the transconductance cell is a differential pair of transistors, and the distortion circuit is a differential pair of transistors having a resistor tuneable by a control circuit. The control circuit may use digital logic to switch in different said resistor values. The differential and distortion circuits may be biased independently at the respective inputs by a resistor and decoupling capacitors to the input of transconductance cell and the distortion circuit.

In a second aspect of the invention, a CMOS mixer is provided having a transconductance circuit and a distortion circuit tuneable by a controller circuit coupled to switching circuit for switching the output current of the summed currents of the differential and distortion circuits. The switched output current is converted to an output voltage by a resistive active load coupled to the switching circuit.

In a third aspect of the invention a CMOS amplifier is provided having a differential circuit and a distortion circuit tuneable by a controller circuit coupled to active resistive elements for converting said output current to an output voltage.

Other aspects and features of the invention will become apparent to those ordinarily skilled in the art upon review of the following description of specific embodiments of the invention in conjunction with the accompanying figures.

BRIEF DESCRIPTION OF THE DRAWINGS

Embodiments of the invention will now be described, by way of example only, with reference to the attached Figures, wherein.

DETAILED DESCRIPTION

Generally, the invention provides a system for cancelling third-order intermodulation in CMOS RF circuitry. In particular, a transconductance circuit produces an output current as a function of an input voltage, having a transconductance and a third order intermodulation, which is cancelled by the output current of a tuneable distortion circuit coupled to the differential circuit while the transconductance is comparatively unchanged.

Figure 1:
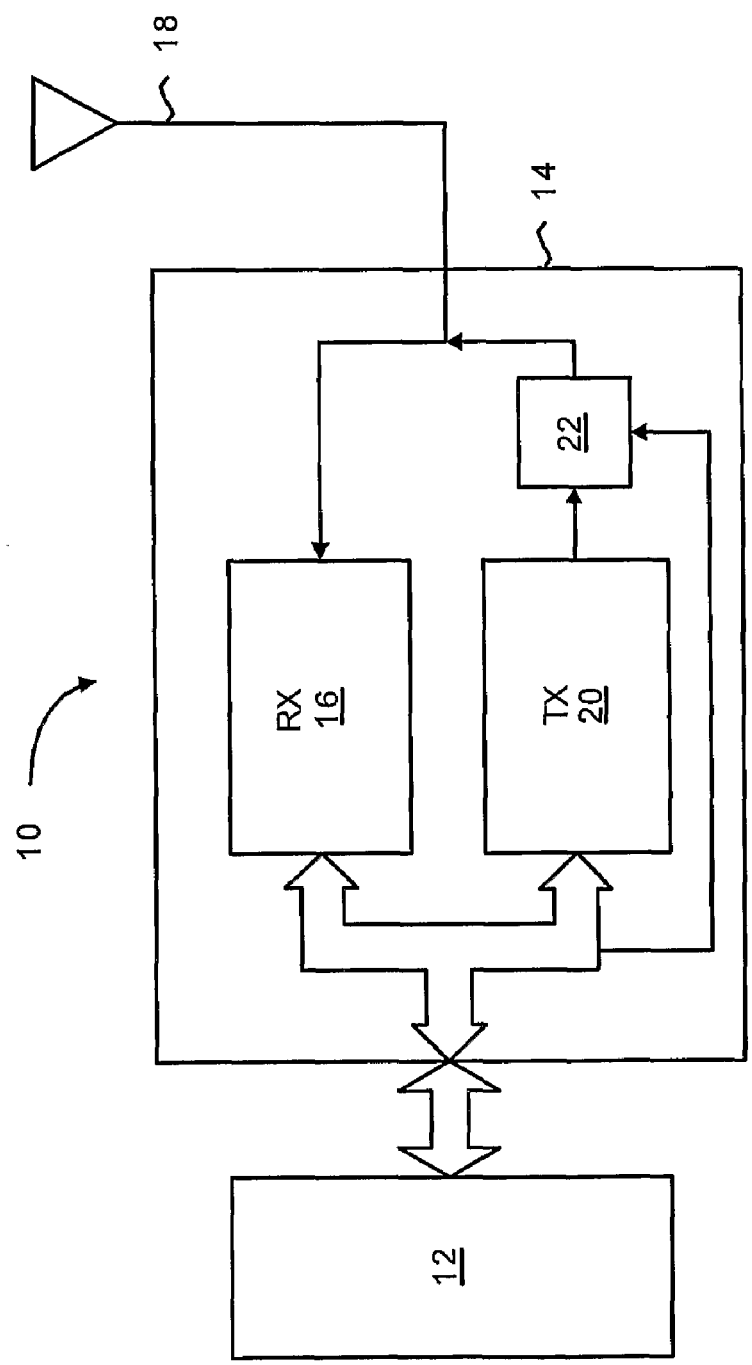
FIG. 1 is a block diagram of the core components of a wireless device.
Figure 2:
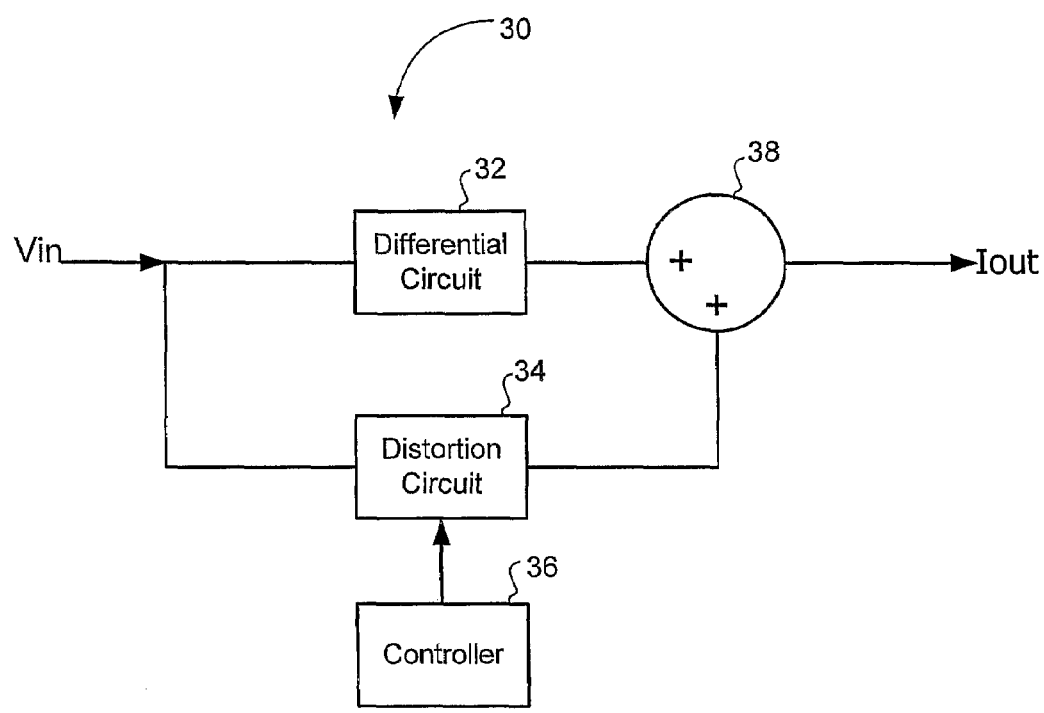
FIG. 2 is a block diagram of a transconductor for cancelling third-order intermodulation.

FIG. 2 shows a block diagram of a transconductor for cancelling third-order intermodulation. The transconductor 30 can be used in any of the blocks in FIG. 1. The transconductor 30 has a main transconductance circuit 32, a tuneable distortion circuit 34 and a controller circuit 36. The differential circuit 32 generates an output current having a transconductance gain component and an IM3 component, based on the input voltage, $V_{in}$. The distortion circuit 34 generates an output current of opposite phase to the output current of the main transconductance circuit output current and minimal transconductance comparatively. The IM3 of the distortion circuit current is tuned by the controller circuit 36 to match the amplitude of the IM3 of the transconductance circuit. The currents are summed in 38 so that the IM3 components substantially cancel out and the transconductance gain component remain substantially unchanged.

Figure 3:
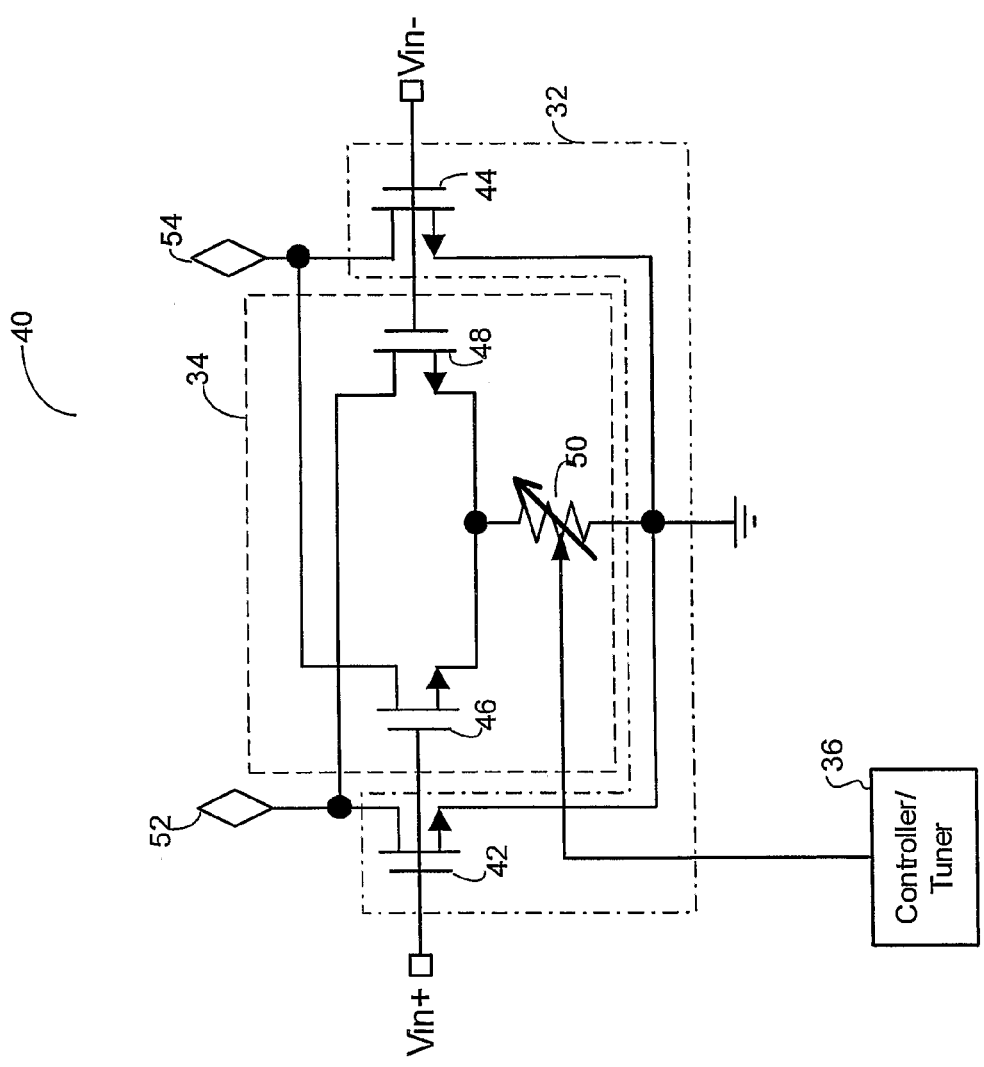
FIG. 3 is a circuit of a transconductor for cancelling third-order intermodulation.

The transconductance circuit 32 is a differential set of transistors. The operation of a differential set of transistors is well known in the art. In an example of a transconductor 40 as described in FIG. 2, FIG. 3 shows the differential set of transistors to be MOSFETs 42, 44, having differential inputs at the gate, and grounded at the source. The distortion circuit 34 in this example is also a pair of MOSFETs 46, 48 with the sources connected to a resistor 50 or set of switchable resistors that goes to ground and is controllable by a control circuit (not shown). The distortion MOSFETs 46, 48, and the resistor 50 produce an IM3 being a function of the resistor value. The distortion MOSFETs are designed to have a minimal transconductance element. When summed together at the outputs 52, 54, the currents from the distortion circuit and the differential circuit substantial cancel out depending on the value of the variable resistor. The control circuitry may preferably consist of digital switches and analog switches to change the resistor value. The resistor values may change in a continuous manner or in a discrete manner. The control circuitry may also change the resistor value in an analog sense; that is, the resistor element 50 is made up of active elements.

Figure 4:
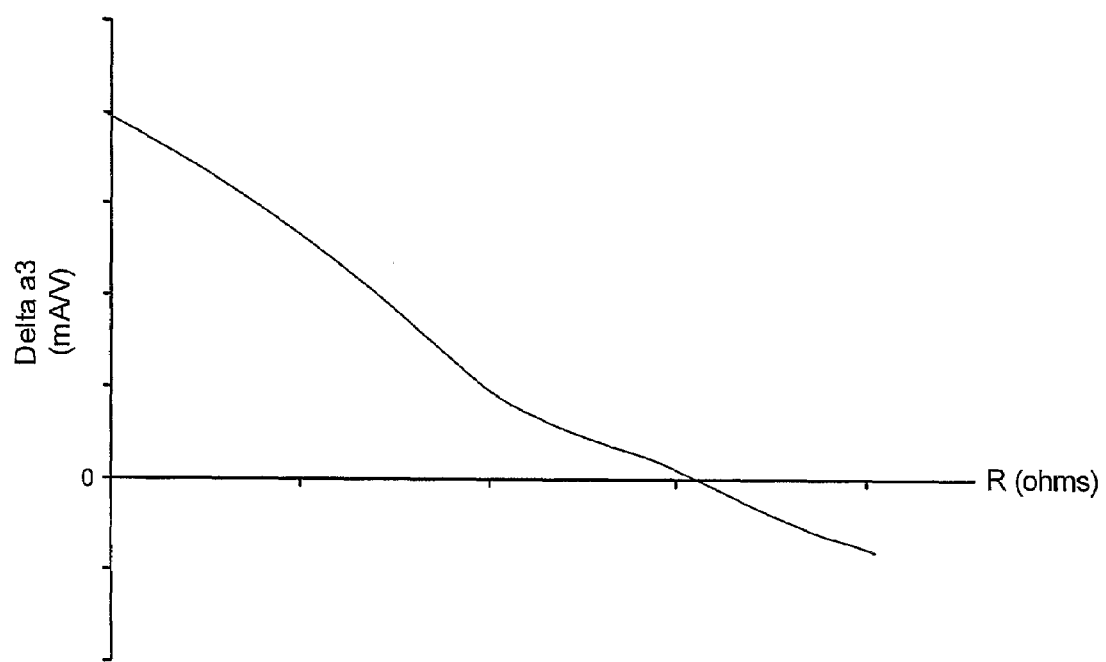
FIG. 4 is a plot of the difference in third-order modulation elements versus resistance of a tuning element.

The plot in FIG. 4 shows the relationship between the resistance of the tuneable distortion circuit and IM3 as measured at the differential output. As resistance changes the difference between the two IM3 components change and an optimal resistance is found when the difference between the two IM3 components is zero.

Figure 5:
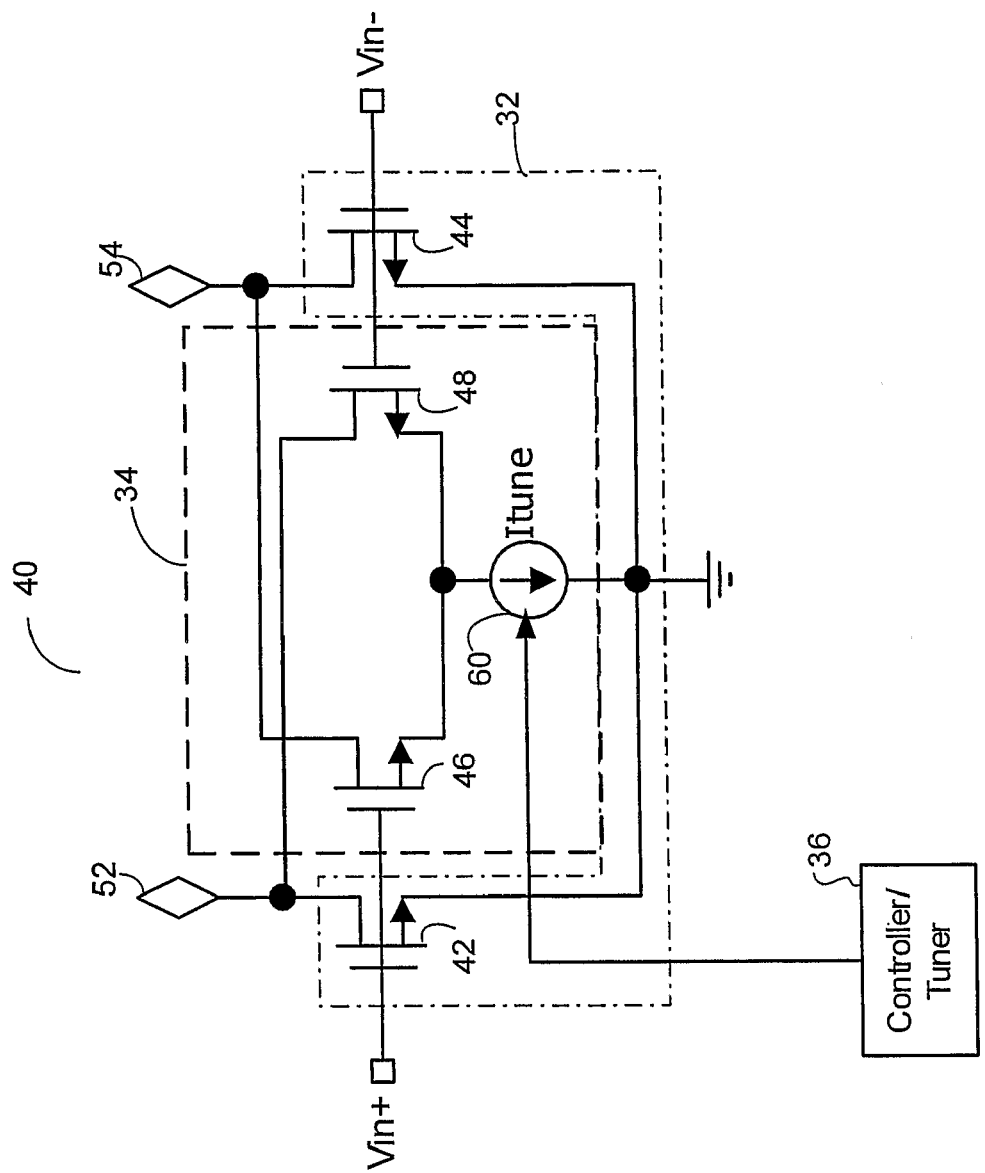
FIG. 5 is a circuit of a transconductor for cancelling third-order intermodulation using a current source.

FIG. 5 shows a circuit of a transconductor 40 for cancelling third-order intermodulation using a current source 60 as opposed to a resistor 50 as shown in FIG. 3. In this example, a tuning current source having $I_{tune}$ is used to nullify the IM3. The current $I_{tune}$ controls the amount of IM3 component generated by the distortion circuit 34.

Figure 6:
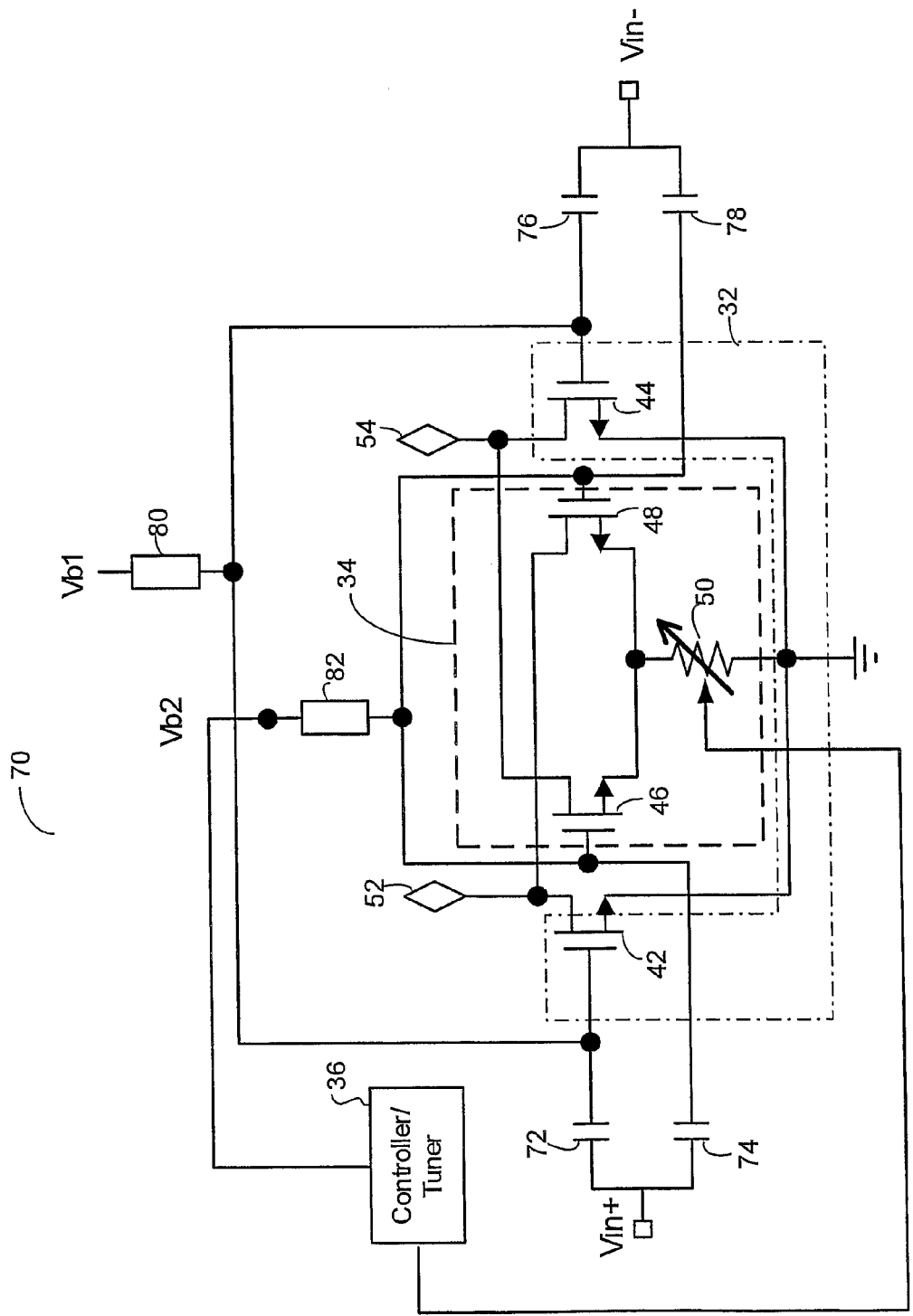
FIG. 6 is a circuit of a transconductor for cancelling third-order intermodulation showing the main transconductance cell and the distortion cell with a DC biased.

FIG. 6 shows the differential circuit and the distortion circuit of the transconductor being independently biased by decoupling capacitors 72, 74 and 76, 78. Decoupling capacitors are placed between the two input pairs. Biasing voltages Vb1, Vb2 are applied to the loads 80, 82, which are used to isolate the signal from the biasing voltages. Such biasing may be used to aid in the reduction of IM3 products. In this example, resistor 50 may be replaced with a current source 60 as shown in FIG. 5. In this figure, the IM3 is either controlled by the resistor 50, Vb2, or both.

Figure 7:
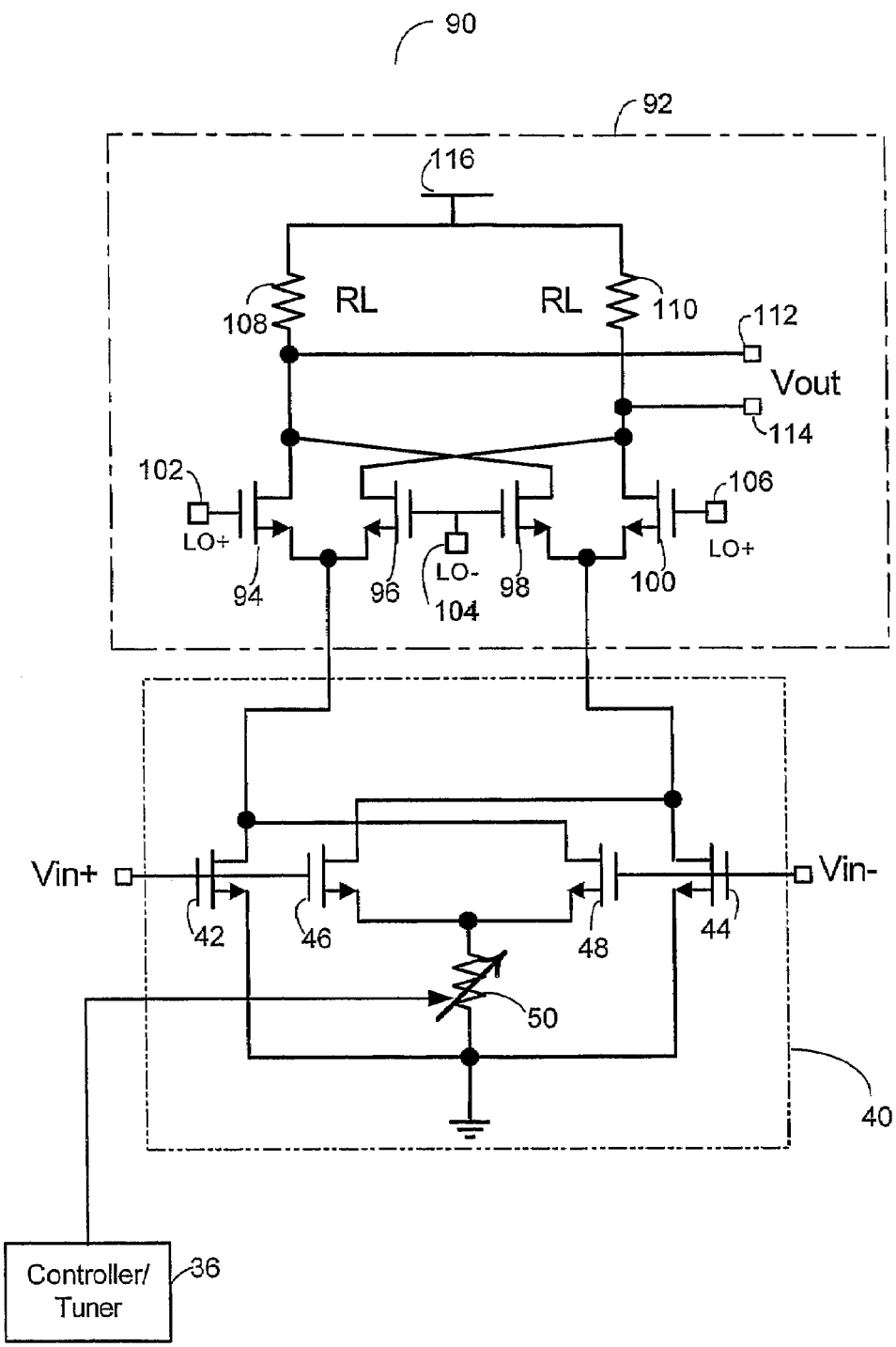
FIG. 7 is a circuit of a mixer using the transconductor for cancelling third-order intermodulation.

An example of how the transconductor may be used in an application is shown in FIG. 7 where the circuit 90 has a transconductor 40, which is coupled to a switching circuit 92 to create a mixer circuit. The transconductance current produced by the MOSFETs 42, 44, 46, 48 of the transconductor 40 is switched by the local oscillator LO signals 102, 104, 106 (or from a signal that is generated from a local oscillator) and converted into an output voltage by the RL active loads 108, 110. The FETs 94, 96, 98, and 100 make up a mixing switching quad which is well known in the art today. The output $V_{out}$ 112, 114 is either a down or up converted signal of $V_{in}$ in the frequency domain. In this application, the transconductor 40 may use a current source in place of the tuneable resistor 50. The transconductor in this example may also be biased according to FIG. 6.

Figure 8:
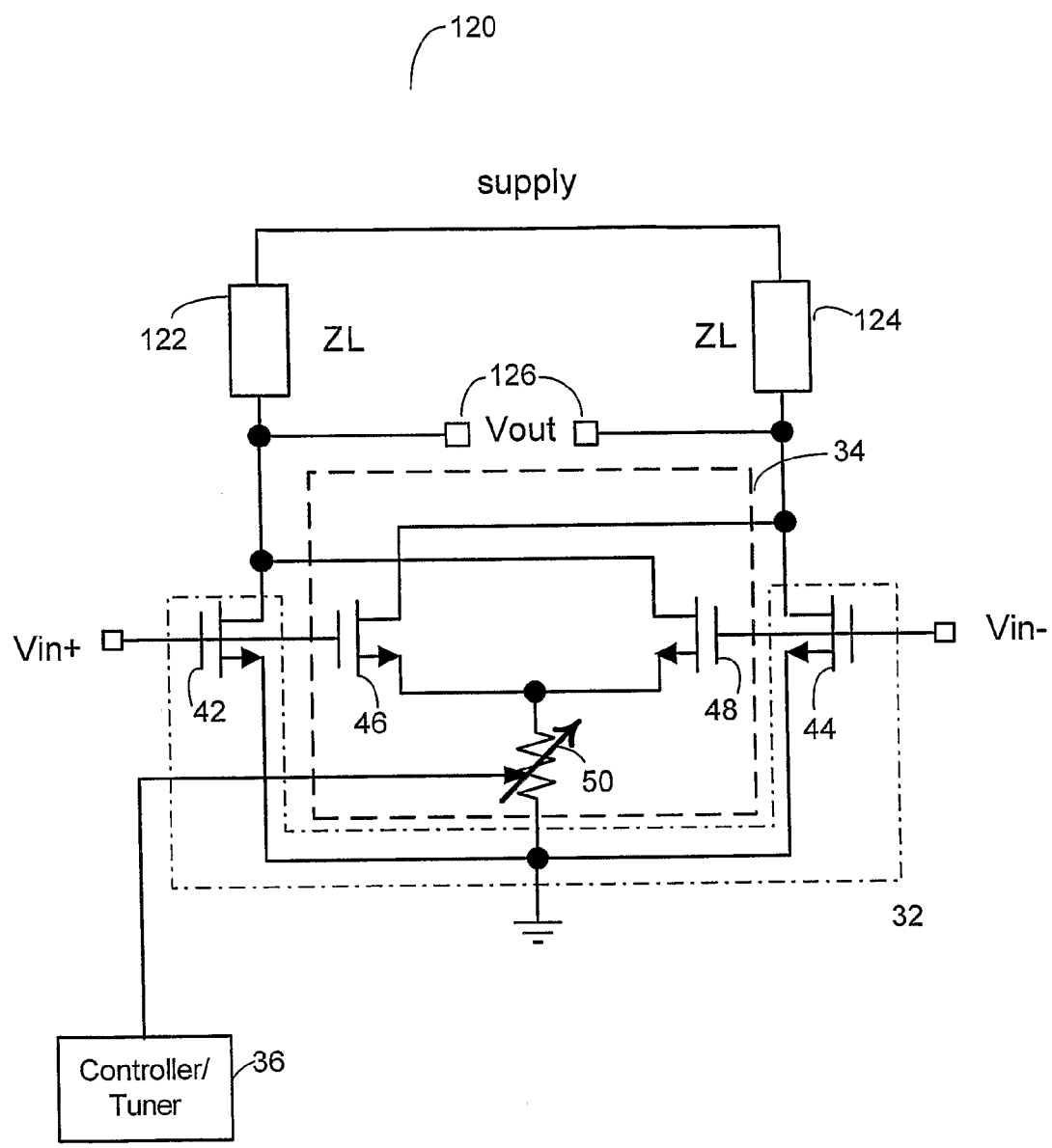
FIG. 8 is a circuit of an amplifier using the transconductor for cancelling third-order intermodulation.

Another example of a use of the transconductor circuit is shown in FIG. 8 where the transconductor is used in an amplifier circuit 120. Here the active loads 122, 124 convert the output current of the transconductor into a voltage $V_{out}$ at the output 126.

The above-described embodiments of the invention are intended as examples only. Alterations, modifications and variations may be effected to the particular embodiments by those of skill in the art without departing from the scope of the invention, which is defined solely by the claims appended hereto.

What is claimed is:

1. A CMOS transconductor for cancelling third-order intermodulation of an output current corresponding to an input voltage comprising:
   a transconductance circuit for generating a first current as a function of said input voltage, said first current having a transconductance gain element and a first third-order intermodulation element, said transconductance circuit comprising a first differential cell having a first and second transistor;
   a tuneable distortion circuit coupled to said transconductance circuit for generating a second current having a second third-order intermodulation element of opposite phase to said first third-order intermodulation element, said distortion circuit including a second differential cell and a current source; and
   a controller circuit for tuning said current source of said distortion circuit to adjust said second third-order intermodulation element to substantially equal said first third-order intermodulation element, said distortion circuit and transconductance circuit arranged to sum said first and second currents generating said output current substantially having said transconductance gain element and substantially cancelling said first and second third-order intermodulation elements thereof.

2. The CMOS transconductor of claim 1, wherein said second distortion circuit comprises a third and fourth transistor.

3. The CMOS transconductor of claim 1, wherein said distortion circuit further comprises a resistance tuneable by said controller circuit.

4. The CMOS transconductor of claim 1, wherein said controller circuit comprises digital circuitry and analog circuitry for changing the value of the said current source or said resistance.

5. The CMOS transconductor of claim 1, wherein said first and second transistors are biased by decoupling capacitors.

6. The CMOS transconductor of claim 5, wherein a first resistive load biases input of said transconductance circuit and a second resistive load biases inputs of said distortion circuit.

7. A CMOS mixer comprising:
   a transconductance circuit for generating a first current as a function of said input voltage, said first current having a transconductance gain element and a first third-order intermodulation element in the third-order, said transconductance circuit comprising a first differential cell having a first and second transistor;
   a tuneable distortion circuit coupled to said transconductance circuit for generating a second current having a second third-order intermodulation element of opposite phase to said first third-order intermodulation element, said distortion circuit including a second differential cell and a current source;
   a controller circuit for tuning said current source of said distortion circuit to adjust said second third-order intermodulation element to substantially equal said first third-order intermodulation element in amplitude, said distortion circuit and transconductance circuit arranged to sum said first and second currents generating said output current substantially having said transconductance gain element and substantially cancelling said first and second third-order intermodulation elements thereof; and
   a switching circuit coupled to outputs of said transconductance and distortion circuits, for switching said output current, said switched output current converted to an output voltage by an active resistive load coupled to said switching circuit.

8. The CMOS mixer of claim 7, wherein said second differential cell comprises a third and fourth transistor.

9. The CMOS mixer of claim 8, wherein said distortion circuit further comprises a resistance load tuneable by said controller circuit.

10. The CMOS mixer of claim 8, wherein said controller circuit comprises digital circuitry and analog circuitry for changing the value of the said current source or said resistance.

11. A CMOS amplifier comprising:
    a transconductance circuit for generating a first current as a function of said input voltage, said first current having a transconductance gain element and a first third-order intermodulation element in the third-order, said transconductance circuit comprising a first differential cell having a first and second transistor;
    a tuneable distortion circuit coupled to said transconductance circuit for generating a second current having a second third-order intermodulation element of opposite phase to said first third-order intermodulation element, said distortion circuit including a second differential cell and a current source;
    a controller circuit for tuning said current source of said distortion circuit to adjust said second third-order intermodulation element to substantially equal said first third-order intermodulation element in amplitude, said distortion circuit and transconductance circuit arranged to sum said first and second currents generating said output current substantially having said transconductance gain element and substantially cancelling said first and second third-order intermodulation elements thereof; and
    active resistive loads coupled to outputs of said transconductance and distortion circuits, said active resistive loads for converting said output current to an output voltage.

12. The CMOS amplifier of claim 11, wherein said distortion circuit further comprises a current source tuneable by said controller circuit.

13. The CMOS transconductor of claim 11, wherein said controller circuit comprises digital circuitry and analog circuitry for changing the value of the said current source or said resistance.

14. A CMOS transconductor for cancelling third-order intermodulation of an output current corresponding to an input voltage comprising:
    a transconductance circuit for generating a first current as a function of said input voltage, said first current following a first current path and having a transconductance gain element and a first third-order intermodulation element, said transconductance circuit comprising a first differential cell having a first and second transistor;

a tuneable distortion circuit coupled to said transconductance circuit for generating a second current having a second third-order intermodulation element of opposite phase to said first third-order intermodulation element, the second current following a second current path decoupled from the first current path, said distortion circuit including a second differential cell and a current source; and a controller circuit for tuning said current source of said distortion circuit to adjust said second third-order intermodulation element to substantially equal said first third-order intermodulation element, said distortion circuit and transconductance circuit arranged to sum said first and second currents generating said output current substantially having said transconductance gain element and substantially cancelling said first and second third-order intermodulation elements thereof.

15. A CMOS amplifier comprising:

a transconductance circuit for generating a first current as a function of said input voltage, said first current having a transconductance gain element and a first third-order intermodulation element in the third-order, said transconductance circuit comprising a first differential cell having a first and second transistor;

a tuneable distortion circuit coupled to said transconductance circuit for generating a second current having a second third-order intermodulation element of opposite phase to said first third-order intermodulation element, said distortion circuit including a second differential cell and a resistance load;

a controller circuit for tuning said resistance load of said distortion circuit to adjust said second third-order intermodulation element to substantially equal said first third-order intermodulation element in amplitude, said distortion circuit and transconductance circuit arranged to sum said first and second currents generating said output current substantially having said transconductance gain element and substantially cancelling said first and second third-order intermodulation elements thereof; and active resistive loads coupled to outputs of said transconductance and distortion circuits, said active resistive loads for converting said output current to an output voltage.

* * * * *